United States Patent [19]

Alberti et al.

[11] 4,098,923
[45] Jul. 4, 1978

[54] PYROLYTIC DEPOSITION OF SILICON DIOXIDE ON SEMICONDUCTORS USING A SHROUDED BOAT

[75] Inventors: Robert Stanley Alberti; Jon Charles Goldman, both of Tempe, Ariz.

[73] Assignee: Motorola, Inc., Schaumburg, Ill.

[21] Appl. No.: 693,382

[22] Filed: Jun. 7, 1976

[51] Int. Cl.² ............................................ B05D 5/12
[52] U.S. Cl. ........................................ 427/85; 427/93; 427/95; 427/248 C; 427/255; 427/295; 427/300; 148/1.5; 148/188; 118/49; 118/500; 118/504
[58] Field of Search ................ 427/85, 93, 95, 248 C, 427/255, 282, 287, 294, 300, 314; 118/48, 49, 504, 500; 148/188

[56] References Cited

U.S. PATENT DOCUMENTS

| | | |
|---|---|---|
| 3,098,763 | 7/1963 | Deal et al. ............................. 118/48 |
| 3,481,781 | 12/1969 | Kom .................................... 427/95 |
| 3,598,082 | 8/1971 | Rice .................................... 118/48 |
| 3,706,597 | 12/1972 | Li et al. ............................... 427/95 |
| 3,854,443 | 12/1974 | Baerg .................................. 118/49 |
| 3,900,597 | 8/1975 | Chruma et al. ..................... 118/49 |
| 3,934,060 | 1/1976 | Burt et al. ........................... 427/95 |
| 4,005,240 | 1/1977 | Schlacter ............................ 427/95 |
| 4,018,183 | 4/1977 | Meuleman ........................... 118/49 |

OTHER PUBLICATIONS

Eshbach et al., "Emitter Diffusion Systems" IBM Technical Disclosure Bulletin, vol. 13, No. 6, Nov. 1970.

*Primary Examiner*—John T. Goolkasian
*Attorney, Agent, or Firm*—John A. Fisher

[57] ABSTRACT

Silicon dioxide is pyrolytically deposited by the reaction of silane with oxygen on vertically mounted substrates in an evacuated system. A standard diffusion furnace equipped with a furnace tube which is vacuum tight is used. Injection tubes having multiple injection ports are positioned within the furnace tube to distribute the silane and the oxygen uniformly across a plurality of substrates which are positioned perpendicular to the furnace tube axis in a boat covered with a perforated shroud. The process is particularly useful in providing for the low temperature deposition of uniform layers of silicon dioxide on silicon wafers to be used in the fabrication of semiconductor devices.

11 Claims, 2 Drawing Figures

PYROLYTIC DEPOSITION OF SILICON DIOXIDE ON SEMICONDUCTORS USING A SHROUDED BOAT

BACKGROUND

This invention relates to the pyrolytic deposition of a uniform film of silicon dioxide onto a heated substrate. More particularly, this invention relates to the deposition of silicon dioxide on a vertically positioned substrate by reacting silane with oxygen in an evacuated system.

Silicon dioxide ($SiO_2$) is a dense, chemically inert, dielectric material of extreme hardness, low thermal conductivity and high resistance to molecular diffusion. These properties have made silicon dioxide an attractive and valuable material for a wide range of applications. For example, in the fabrication of semiconductor devices, silicon dioxide is useful in forming the intermediate dielectric layers of multi-layer metal devices and in forming the final passivation coating for a completed device. Further applications for deposited layers of doped silicon dioxide are as diffusion sources for doping silicon and for reflow glass processes. Relatively thick layers of silicon dioxide are also used to form the field oxide layer of MOSFET semiconductor devices.

Although prior art processes for the deposition of silicon dioxide are functional in certain applications, these processes present drawbacks in other areas. In general, it has been found to be extremely difficult to deposit silicon dioxide onto semiconductor substrates in a manner that will allow good growth rates, uniform deposition and a high quality coating in an economical process in which a large quantity of semiconductor substrates can be coated at the same time.

One class of prior art systems can be categorized as "one atmosphere" systems in which silicon dioxide is deposited by oxidizing silane on the surfaces of semiconductor substrates which are heated to 350° to 450° C. The substrates are horizontally mounted inside an unpressurized chamber (commonly called a reactor) whose walls are maintained at approximately room temperature. Although the formation of silicon dioxide tends to be localized at the heated surface of the substrate, a gas phase reaction is spontaneous at room temperature and must be moderated by diluting the reactance with nitrogen. Some of the problems associated with this type of deposition are: (1) The gas phase reaction cannot be totally eliminated so particles of silicon dioxide thus formed can be carried to the surface of the substrate causing pinholes in the silicon dioxide coating. (2) The substrates are mounted horizontally so that the particles that fall off the reactor walls land on the substrate surface, again causing pinholes. The reactor walls must be cleaned frequently to minimize this problem. (3) The method used to heat the substrates, which typically involves placing the substrates on a heated surface inside the reactor, makes it difficult to obtain the accurate control of substrate temperatures required to maintain the desired coating composition and deposition rate. (4) The flow rates of nitrogen, oxygen and silane must be controlled throughout the entire deposition to maintain a uniform coating necessitating expensive and complicated gas flow panels.

Another class of prior art systems is partial vacuum deposition systems. Silicon dioxide is deposited by oxidizing silane on the surfaces of semiconductor substrates which are heated inside an evacuated chamber. For certain applications, other gases such as phosphine are included with the silane to deposit "doped" silicon dioxide. Typically, heating is accomplished by adapting a diffusion tube to allow evacuation and then using a standard diffusion furnace to provide well controlled inductive heating. The basic principle or concept involved in this method is to use reduced pressure rather than a nitrogen diluent to moderate and control the gas phase reaction. Because no nitrogen diluent is required, the total gas flow of the system is much lower and any gas phase reaction particles which do form in the vacuum system are less likely to be swept through the system. In such a system, wafers can be mounted vertically and thus do not catch particles falling from the walls of the tube. Further advantages of this method derive from the fact that the art of temperature control has been highly developed in tube type diffusion furnaces where temperature zones of more than 20 inches can be controlled within ±1° C.

In spite of the above advantages obtained with partial vacuum deposition systems, the implementation of these systems to provide high volume deposition of silicon dioxide has proven difficult. Using conventional methods of delivery of silane and oxygen gas to the evacuated chamber and conventional methods for evacuating the chamber, it has been found that silicon dioxide tends to deposit nonuniformly on the silicon substrates within the chamber. This nonuniform deposition takes the form of a thickened ridge or ring around the periphery of the substrate which makes the substrates unsatisfactory for further process steps. In prior art systems, the only method for avoiding this nonuniform deposition has been to severely restrict the number of substrates deposited at one time so that they can be widely spaced with respect to each other inside the evacuated chamber and further to greatly reduce the flow rate of the reactant gases with the effect that the resultant deposition rate is very low. These limitations severely restrict the process throughput and accordingly increase the cost, thereby severely limiting the applicability of this method of silicon dioxide deposition for high volume production operations.

SUMMARY

Accordingly, it is an object of this invention to provide an improved method for the vacuum deposition of doped or undoped silicon dioxide.

It is a further object of this invention to provide an improved method in which doped or undoped silicon dioxide is pyrolytically deposited by the reaction of silane and appropriate dopant gases with oxygen on a plurality of vertically mounted substrates in an evacuated system.

Briefly described, the present invention is an improved method for pyrolytically depositing doped or undoped silicon dioxide on the surface of the semiconductor substrate in which a plurality of substrates are positioned within a perforated shroud in an interior region of an evacuated chamber, the substrates are heated and reactant gases comprising oxygen and silane are delivered via multiple port injection means which localize the injection of the reactant gases to the interior region.

DETAILED DESCRIPTION

Figure 1:
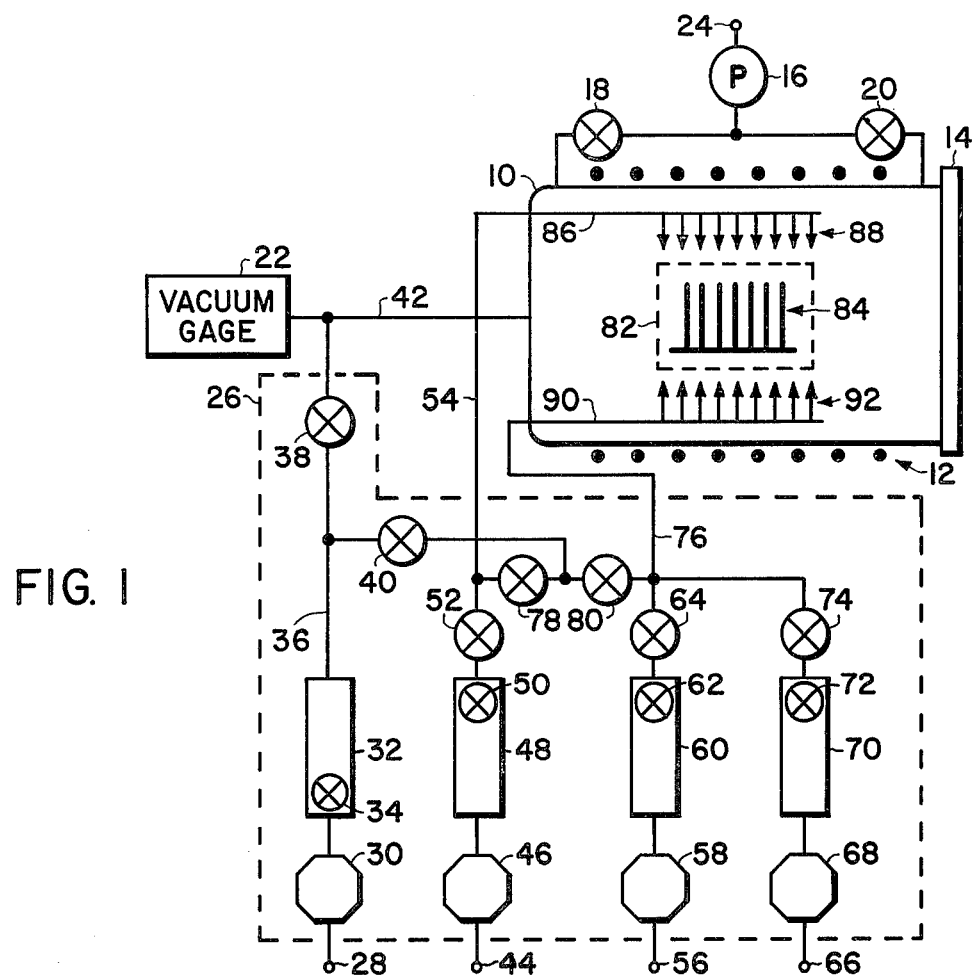
FIG. 1 is a schematic view of an apparatus for use in the process of this invention.

FIG. 1 shows a furnace tube 10 which is heated by resistance heat coils 12. The electric current through resistance heat coils 12 is precisely controlled to maintain a desired uniform temperature throughout the interior of furnace tube 10. Furnace tube 10 is provided with an end cap 14 which provides a vacuum seal. A vacuum pump 16 couples to each end of furnace tube 10 via vacuum balance valves 18 and 20 such that furnace tube 10 can be evacuated to a desired pressure as indicated by vacuum gauge 22. Exhaust 24 serves to vent biproducts and unreacted starting materials from furnace tube 10. A gas panel 26 comprising control valves, flow meters and regulators is used to control the delivery of reactant and purging gases to furnace tube 10. Nitrogen source 28 is coupled via regulator 30 to flow meter 32 which includes flow control valve 34. Nitrogen line 36 couples from flow meter 32 to nitrogen backfill valve 38 and to auxiliary nitrogen valve 40. Auxiliary nitrogen valve 40 provides the source of nitrogen for purging as is described in more detail below. Nitrogen line 42 couples from backfill valve 38 to furnace tube 10 to provide a means for backfilling furnace tube 10 at the end of a process run. Oxygen source 44 couples to regulator 46 which in turn couples to flow meter 48 which includes flow meter control valve 50. Oxygen flow meter 48 couples to oxygen shutoff valve 52 which in turn couples to oxygen line 54 which delivers oxygen to furnace tube 10. Silane source 56 couples via regulator 58 to flow meter 60 which includes flow meter control valve 62 and which couples to silane shutoff valve 64. Phosphine source 66 couples via regulator 68 to flow meter 70 which includes flow meter control valve 72 and which couples to phosphine shutoff valve 74. In an alternative embodiment used for depositing boron doped silicon dioxide (not shown), a source of diborane couples via regulator 68 to flow meter 70 and shutoff valve 74. Shutoff valve 64 and 74 couple to reactant line 76 which delivers reactant gases to furnace tube 10. Purging valve 78 and 80 couple respectively to oxygen line 54 and reactant line 76 and couple in common to auxiliary nitrogen valve 40 thereby providing means for purging lines 54 and 76 with nitrogen before and after a process run.

Figure 2:
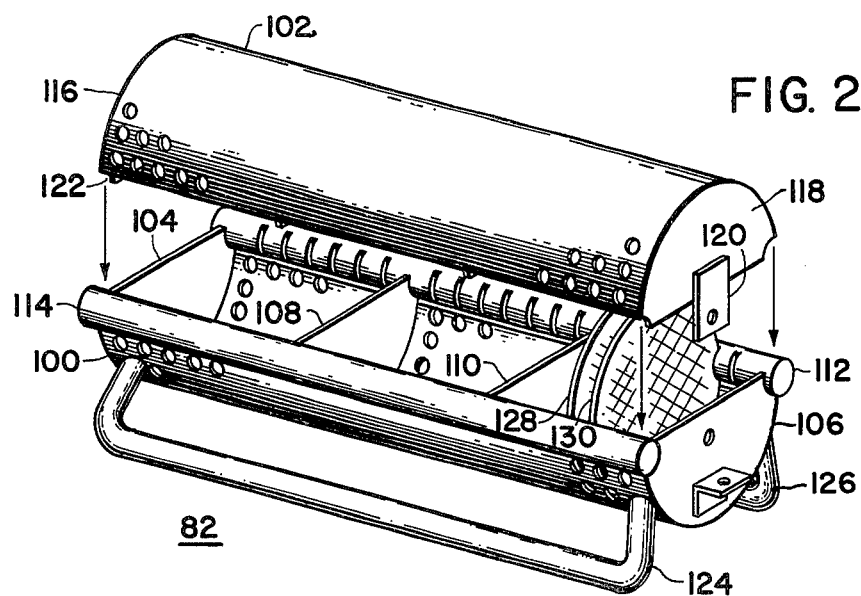
FIG. 2 is an exploded isometric view of a substrate holder or "boat" having a perforated shroud and suitable for use in the practice of this invention.

As shown schematically in FIG. 1, furnace tube 10 holds a shrouded boat 82 loaded with a plurality of semiconductor substrates 84 which are positioned with their broad surfaces perpendicular to the cylindrical axis of the tube. Shrouded boat 82 whose detailed features are shown in FIG. 2 and are discussed below, is positioned in the interior region of furnace tube 10. Oxygen line 54 couples to an injector tube or manifold 86 which is provided with a plurality of injection ports 88 arranged to localize the injection of oxygen to the vicinity of the shrouded boat 82. In a similar manner, reactant line 76 couples to injector tube or manifold 90 which is provided with a plurality of injection ports 92 which localize the injection of reactant gases to the vicinity of shrouded boat 82. In a preferred embodiment for practicing the process of the present invention, furnace tube 10 is a vacuum tight stainless steel tube which is approximately 78 inches long and which has a 4 inch inside diameter. This tube is positioned in a standard diffusion furnace such that resistance heating coils 12 establish a well controlled temperature zone approximately 30 inches long along the longitudinal axis of the tube which is centered with respect to either end. Injector tubes 86 and 90 are 3/16 inch diameter stainless steel tubes which extend into furnace tube 10 parallel with its longitudinal axis and are positioned approximately ¼ inch from the inside wall of furnace tube 10. Each of the injector tubes are provided with 7 injection ports or holes 0.010 inches in diameter spaced 3 inches apart facing the longitudinal center line of furnace tube 10.

FIG. 2 is an exploded isometric view showing additional details of shrouded boat 82. In the preferred embodiment the boat is formed as a cylinder 18 inches long and 3⅜ inches in diameter and comprises a lower portion 100 and an upper portion 102. Lower portion 100 is provided with end pieces 104 and 106 and spacers 108 and 110 and is provided with slotted side rails 112 and 114 and a similarly slotted bottom rail 115 (not visible in this view). Top portion 102 similarly has end pieces 116 and 118, spacers (not visible) and is provided with latching bars 120 and 122 which are adapted to hold the upper and lower portions together. Lower portion 100 is provided with rails 124 and 126 which attach to the sides of lower portion 100 and support shrouded boat 82 such that its longitudinal center coincides with the longitudinal center of furnace tube 10 when the boat is loaded into the tube. Lower portion 100 is also provided with a fixture which is used in inserting and withdrawing shrouded boat 82 from the interior region of furnace tube 10. In the preferred embodiment, shrouded boat 82 is made of 1/32 inch thick stainless steel sheet perforated with 1/32 inches diameter holes spaced on 1/16 inch centers. Side rails 112 and 114 are provided with 0.025 inch wide slots spaced 0.2 inches apart such that semiconductor substrates can be positioned vertically inside the boat. For the preferred embodiment, shrouded boat 82 will hold approximately 90 substrates (3 inch diameter wafers) when fully loaded. Wafers 128 and 130 shown in FIG. 2 illustrate the manner in which wafers are positioned within the boat.

The process of this invention is particularly adapted to the low temperature deposition of doped or undoped silicon dioxide layers. In many semiconductor applications, it is required that relatively thick silicon dioxide layers be deposited and that the deposition temperature be low enough to preserve the integrity of the underlying surface such as when intermediate insulating layers are formed in multi-layer metal structures or when the final passivation layer is formed over a metallized semiconductor device. Generally, temperatures of 400° to 500° C must be employed to avoid damage to the underlying surfaces. In prior art systems, the deposition of uniform silicon dioxide layers at these low temperatures could only be achieved by positioning a relatively small number of semiconductor substrates widely spaced apart in a furnace tube and by severely restricting the flow rate of reactant gases such that the deposition rate and the resultant process throughput were very low. Thus a typical prior art process would require that no more than 25 wafers spaced ½ inch apart were loaded into the furnace tube at one time and that the flow of reactant gases be adjusted for deposition rates of less than 500Å per hour if uniform silicon dioxide layers across the surface of the semiconductor substrates were to be obtained. Since silicon dioxide layers of from 5000Å to 10,000Å thick are typically required, the effective production throughput of prior art systems has been impractically low. By way of contrast, the process of the present invention offers significantly improved performance. The use of injector tubes provides for the delivery of preheated reactant gases and oxygen to the evacuated interior of the furnace tube such that gaseous mixing is localized to the vicinity of the heated semiconductor surfaces. The positioning of the cylindrical surface of the shrouded boat relative to the ports of the injector tubes and relative to the cylindrical inner wall of the tube creates a fluid flow environment which enhances the mixing of the reactant gases and the oxygen. The perforations of the boat shroud form a baffle which further enhances this mixing and also provides a stabilizing reactant surface which produces a more uniform concentration gradiant of the gases across the surfaces of the substrates inside the boat. As a result, the process of the present invention provides a dramatic improvement in deposition rate and process throughput over prior art systems. Using the process, as many as 90 substrates can be processed at a time and the flow rates of the reactant gases and the oxygen can be increased to provide deposition rates of from 6000Å to 10,000Å per hour with no evidence of the nonuniform deposition (ringing) previously encountered at higher deposition rates. The net effect of these results is a significant improvement in production throughput which correspondingly reduces the cost of semiconductor devices manufactured using the process.

The following example will serve to illustrate the practice of this invention.

EXAMPLE I (1) A diffusion furnace was provided with a stainless steel furnace tube adapted for evacuation and equipped with injector tubes as described above and the furnace tube was heated to a stable temperature of 430° C.

(2) A shrouded stainless steel boat of the type described above was loaded with 90 precleaned, 3 inch diameter silicon wafers and the shrouded cover latched into place. In accordance with standard diffusion techniques, three dummy wafers were placed at each end of the boat.

(3) The shrouded boat was inserted in the furnace tube and positioned in the interior region of the tube adjacent to the ports of the injection tube and the end cap of the furnace tube was sealed.

(4) The vacuum pump was actuated and the furnace tube evacuated to a pressure of less than 50μ.

(5) After a pause of three minutes at reduced pressure, the system was purged with nitrogen for at least 45 minutes at a pressure of 1000μ (a flow rate of approximately 250 cc's per minute).

(6) The nitrogen was turned off and the system allowed to pump back down to a pressure less than 50μ.

(7) The oxygen, silane and phosphine shutoff valves were opened with the flow meter control valve set for the following flow rates:

| | |
|---|---|
| oxygen | 39 cc's per minute |
| silane | 13 cc's per minute |
| phosphine | 13 cc's per minute |

These flow rates correspond to a deposition rate of approximately 100Å per minute and produce a phosphorous doped silicon dioxide glass containing 4 percent phosphorous (by weight). Deposition at these flow rates continues for 50 minutes to deposit a 5000Å thick layer of silicon dioxide. On successive runs, the tolerance on deposition rate is ±5 percent, worst case, from run to run.

(8) The oxygen, silane and phosphine shutoff values were all closed to shut off all gases.

(9) The system was again allowed to pump down to a pressure of less than 50μ, the pump-down cycle requiring approximately 3 minutes.

(10) The auxiliary nitrogen value and purging valves were opened for 45 seconds to purge the system with nitrogen.

(11) The system was again allowed to pump down to a pressure of less than 50μ. This pumping step was an additional precaution to make sure that all reactive gases had been swept from the system.

The nitrogen backfill valve was opened to backfill the furnace tube with nitrogen. The backfill was performed at a high flow rate of 7,000 to 8,000 cc's per minute.

(12) The furnace end cap was then removed and the boat unloaded from the furnace tube. The shrouded boat was uncovered and the wafers unloaded immediately. The deposited layer of silicon dioxide was found to be uniform from wafer to wafer ±10 percent and across the surface of each wafer ±1 percent with the wafers exhibiting no haziness.

What is claimed is:

1. A method for pyrolytically depositing silicon dioxide on the surfaces of semiconductor substrates comprising the steps of:
   (a) loading said substrates in a boat;
   (b) surrounding said boat with a cylindrical shroud of perforated metal;
   (c) positioning said shrouded boat in the interior region of a furnace tube such that broad surfaces of said substrates are perpendicular to the longitudinal axis of said furnace tube and the cylindrical axis of said shroud is in the same direction as said longitudinal axis;
   (d) heating said substrate;
   (e) evacuating said furnace tube; and
   (f) injecting oxygen and reactant gas comprising silane into said evacuated furnace tube, each through separate injection tubes positioned in said interior region with said injection tubes having multiple ports located adjacent said shrouded boat to restrict the injection to occur in the vicinity of said shrouded boat and to enhance the mixing of said oxygen and said reactant gas in said vicinity.

2. The method of claim 1 wherein said reactant gases further comprise phosphine such that phosphorous doped silicon dioxide is deposited.

3. The method of claim 2 wherein said heating of said substrate is to a temperature from about 400° to about 500° C.

4. The method of claim 1 wherein said reactant gases further comprise diborane such that boron doped silicon dioxide is deposited.

5. The method of claim 4 wherein said heating of said substrate is to a temperature from about 400° to about 500° C.

6. A method for the pyrolytic deposition of silicon dioxide upon a substrate mounted vertically with respect to the longitudinal axis of a furnace tube which comprises contacting a mixture of silane and oxygen with said vertically mounted substrate which is positioned in a boat surrounded by a shroud of perforated metal located in said furnace tube in a vacuum at an elevated temperature wherein said mixture of silane and oxygen is formed by injecting said silane through a first injection tube and injecting said oxygen through a second injection tube and wherein said first and second injection tubes restrict said injecting to the vicinity of said substrate within said vacuum.

7. The method of claim 6 wherein a temperature from about 400° to about 500° C is employed.

8. The method of claim 5 wherein a vacuum of about 300 millitorr to about 10 torr is employed.

9. The method of claim 6 wherein said mixture further comprises phosphine such that said silicon dioxide is phosphorous doped.

10. The method of claim 6 wherein said first and said second injecting tubes have multiple injection ports through which said silane and said oxygen are injected.

11. The method of claim 10 wherein said multiple injection ports of said first and said second injection tubes face the longitudinal centerline of said furnace tube whereby said perforated shroud, said first and said second injection tubes, and said furnace tube create a fluid flow environment which enhances the mixing of said mixture of silane and oxygen.

* * * * *